(12) United States Patent
Botula et al.

(10) Patent No.: US 8,709,903 B2
(45) Date of Patent: Apr. 29, 2014

(54) SILICON-ON-INSULATOR (SOI) STRUCTURE CONFIGURED FOR REDUCED HARMONICS AND METHOD OF FORMING THE STRUCTURE

(71) Applicant: International Business Machines Corporation, Armonk, NY (US)

(72) Inventors: Alan B. Botula, Essex Junction, VT (US); John J. Ellis-Monaghan, Grand Isle, NY (US); Alvin J. Joseph, Williston, VT (US); Max G. Levy, Essex Junction, VT (US); Richard A. Phelps, Colchester, VT (US); James A. Slinkman, Montpelier, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/018,814

(22) Filed: Sep. 5, 2013

(65) Prior Publication Data

US 2014/0004687 A1 Jan. 2, 2014

Related U.S. Application Data

(62) Division of application No. 13/772,402, filed on Feb. 21, 2013, now Pat. No. 8,564,067, and a division of application No. 12/627,343, filed on Nov. 30, 2009, now Pat. No. 8,471,340.

(51) Int. Cl.
*H01L 21/331* (2006.01)

(52) U.S. Cl.
USPC .......................... 438/311; 438/404; 257/347

(58) Field of Classification Search
USPC ......... 438/149–166, 295, 311, 404–409, 458, 438/459, 479–481, 967; 257/E29.287, 257/347–354
See application file for complete search history.

(56) References Cited

U.S. PATENT DOCUMENTS 5,426,062 A 6/1995 Hwang
(Continued)

FOREIGN PATENT DOCUMENTS

JP 10-284589 A 10/1998

OTHER PUBLICATIONS

U.S. Appl. No. 12/634,893, filed Dec. 10, 2009, Office Action Communication, Sep. 16, 2013, 16 pages.
Brown et al., U.S. Appl. No. 12/187,415, "Integrated Circuit Structure, Design Structure, and Method Having Improved Isolation and Harmonics,", filed Aug. 7, 2008.

(Continued)

*Primary Examiner* — Telly Green
(74) *Attorney, Agent, or Firm* — Gibb & Riley, LLC; Anthony J. Canale

(57) ABSTRACT

Disclosed is semiconductor structure with an insulator layer on a semiconductor substrate and a device layer is on the insulator layer. The substrate is doped with a relatively low dose of a dopant having a given conductivity type such that it has a relatively high resistivity. Additionally, a portion of the semiconductor substrate immediately adjacent to the insulator layer can be doped with a slightly higher dose of the same dopant, a different dopant having the same conductivity type or a combination thereof. Optionally, micro-cavities are created within this same portion so as to balance out any increase in conductivity due to increased doping with a corresponding increase in resistivity. Increasing the dopant concentration at the semiconductor substrate-insulator layer interface raises the threshold voltage (Vt) of any resulting parasitic capacitors and, thereby reduces harmonic behavior. Also disclosed herein are embodiments of a method for forming such a semiconductor structure.

14 Claims, 8 Drawing Sheets

(56) References Cited

U.S. PATENT DOCUMENTS

| | | | |
|---|---|---|---|
| 5,770,886 | A | 6/1998 | Rao et al. |
| 6,072,217 | A | 6/2000 | Burr |
| 6,482,725 | B1 | 11/2002 | Ishida |
| 6,562,666 | B1 | 5/2003 | Park et al. |
| 7,263,337 | B2 | 8/2007 | Struble |
| 7,335,545 | B2 | 2/2008 | Currie |
| 7,700,405 | B2 | 4/2010 | Min et al. |
| 7,795,702 | B2 | 9/2010 | Min et al. |
| 2002/0011628 | A1 | 1/2002 | Takagi |
| 2003/0209780 | A1 | 11/2003 | Burr |
| 2004/0169225 | A1 | 9/2004 | Burden |
| 2004/0169227 | A1 | 9/2004 | Wei et al. |
| 2005/0108495 | A1 | 5/2005 | McKenney et al. |
| 2005/0176204 | A1 | 8/2005 | Langdo et al. |
| 2005/0250274 | A1 | 11/2005 | Forbes et al. |
| 2006/0118868 | A1 | 6/2006 | Yoshimura et al. |
| 2006/0170515 | A1 | 8/2006 | Yoshida et al. |
| 2006/0194421 | A1 | 8/2006 | Ieong et al. |
| 2006/0194558 | A1 | 8/2006 | Kelly |
| 2007/0018247 | A1 | 1/2007 | Brindle et al. |
| 2007/0096225 | A1 | 5/2007 | Khemka et al. |
| 2007/0264795 | A1 | 11/2007 | Miller et al. |
| 2008/0076371 | A1 | 3/2008 | Dribinsky et al. |
| 2008/0117894 | A1 | 5/2008 | McMorrow |
| 2008/0142935 | A1 | 6/2008 | Montoriol et al. |
| 2008/0203519 | A1 | 8/2008 | Min et al. |
| 2009/0110898 | A1 | 4/2009 | Levy et al. |
| 2009/0233420 | A1 | 9/2009 | Kusaba et al. |
| 2009/0291533 | A1 | 11/2009 | Ebbers et al. |
| 2010/0136760 | A1 | 6/2010 | Yoshie |
| 2010/0164056 | A1 | 7/2010 | Min et al. |
| 2011/0127529 | A1 | 6/2011 | Botula et al. |
| 2011/0131542 | A1 | 6/2011 | Botula et al. |

OTHER PUBLICATIONS

Brown et al., U.S. Appl. No. 12/187,419, "Integrated Circuit Structure, Design Structure, and Method Having Improved Isolation and Harmonics,", filed Aug. 7, 2008.

Baine et al., "Cross-Talk Suppression in SOI Substrates," Solid State Electronics, vol. 49, Issue 9, Sep. 2005, pp. 1461-1465.

PCT/US2010/050805, International Search Report, May 30, 2011, 9 pages.

Botula, et al., U.S. Appl. No. 12/634,893, filed Dec. 10, 2009, Office Action Communication, Oct. 4, 2012, 25 pages.

Botula, et al., U.S. Appl. No. 12/634,893, filed Dec. 10, 2009, Office Action Communication, Jan. 23, 2013, 9 pages.

Botula et al., U.S. Appl. No. 12/627,343, Office Action Communication dated Feb. 21, 2012, 5 pages.

Botula et al., U.S. Appl. No. 12/627,343, Office Action Communication dated Apr. 26, 2012, 11 pages.

Botula et al., U.S. Appl. No. 12/627,343, Office Action Communication dated Aug. 7, 2012, 7 pages.

Botula et al., U.S. Appl. No. 12/627,343, Office Action Communication dated Dec. 17, 2012, 10 pages.

Botula et al., U.S. Appl. No. 12/627,343, AdvisoryAction Communication dated Jan. 28, 2013, 3 pages.

Botula, et al., U.S. Appl. No. 12/627,343, filed Nov. 30, 2009, Notice of Allowance Communication, Feb. 22, 2013, 11 pages.

DE Patent Application No. 11 2010 004 612.3, DE Office Action Communication, Nov. 7, 2012, 6 pages (No Translation).

U.S. Appl. No. 12/634,893, filed Dec. 10, 2009, Office Action Communication, Jun. 6, 2013, 24 pages.

U.S. Appl. No. 13/772,402, filed Feb. 21, 2013, Office Action Communication, Apr. 16, 2013, 5 pages.

U.S. Appl. No. 13/772,402, filed Feb. 21, 2013, Office Action Communication, May 9, 2013, 21 pages.

U.S. Appl. No. 13/772,402, filed Feb. 21, 2013, Notice of Allowance Communication, Jun. 7, 2013, 8 pages.

Botula, et al., U.S. Appl. No. 12/634,893, filed Dec. 10, 2009, Notice of Allowance Communication, Dated Nov. 29, 2013. 12 pages.

SILICON-ON-INSULATOR (SOI) STRUCTURE CONFIGURED FOR REDUCED HARMONICS AND METHOD OF FORMING THE STRUCTURE

CROSS-REFERENCE TO RELATED APPLICATIONS

This application is a divisional of U.S. patent application Ser. No. 13/772,402, filed Feb. 21, 2013, Issued as U.S. Pat. No. 8,564,067 on Oct. 22, 2013, which is a divisional of U.S. patent application Ser. No. 12/627,343, filed Nov. 30, 2009, Issued as U.S. Pat. No. 8,471,340 on Jun. 25, 2013, the complete disclosure of which is incorporated herein by reference.

BACKGROUND

1. Field of the Invention

The embodiments relate generally to semiconductor structures and, more particularly, to a silicon-on-insulator (SOI) structure configured for reduced harmonics and a method of forming the structure.

2. Description of the Related Art

Silicon-on-insulator (SOI) structures typically comprise a silicon substrate, an insulator layer (e.g., a buried oxide (BOX) layer) above the substrate, and device layer (i.e., a silicon layer from which integrated circuit devices are formed) above the insulator layer. Such SOI structures offer a number of advantages over bulk silicon structures with respect to the formation of integrated circuit devices generally (e.g., reduction in parasitic capacitances, elimination of latch-up, better control of short channel effects, etc.). However, at least one disadvantage has been noted with respect to the formation of radio frequency (RF) switches using conventional SOI substrates.

Specifically, the Federal Communications Commission (FCC) has set limits (i.e., specifications) on harmonics generation in RF switch applications. Unfortunately, an RF switch formed using a conventional SOI substrate oftentimes will generate second and third order harmonics beyond the FCC limits. That is, in the case of an RF switch on a conventional SOI substrate, a fixed charge (i.e., a trapped charge) either within the insulator layer or at the interface between the insulator layer and the silicon substrate can result in an inversion charge at the top surface of the silicon substrate adjacent to the insulator layer. This inversion charge can result in the generation of harmonics, including second and third order harmonics. Harmonics are generated when the impedance characteristic of a circuit is not constant with an input signal. A second order harmonic is typically seen from a linear response in impedance (i.e., when impedance is a function of the input signal). A third order harmonic is typically seen from a quadratic response in impedance (i.e., when impedance is a function of the square of the input signal). Considering these second and third order harmonics, the resulting RF switch may easily exhibit harmonics beyond the FCC limits. Therefore, there is a need in the art for a SOI structures configured for reduced harmonics and a method of forming the structure.

SUMMARY

Disclosed herein are embodiments of a semiconductor structure and, more particularly, a silicon-on-insulator (SOI) structure, configured for reduced harmonics. Specifically, the structure embodiments can comprise a semiconductor substrate, an insulator layer on the semiconductor substrate and a device layer on the insulator layer. The semiconductor substrate can have a given conductivity type, a first surface (e.g., a bottom surface) and a second surface above the first surface. Additionally, the semiconductor substrate can comprise a first portion (i.e., a lower portion) and a second portion (i.e., an upper portion) above the first portion. The first portion can be adjacent to the first surface and can comprise, in a first concentration, a dopant having the given conductivity type. The second portion can extend from the first portion up to the second surface and can comprise, in a second concentration that is greater than the first concentration, any of the following: the same dopant as in the first portion, a different dopant than that in the first portion but with the same conductivity type, or a combination thereof. Optionally, the second portion can also comprise a plurality of micro-cavities so as to balance out, within the second portion, a dopant induced increase in conductivity with a corresponding micro-cavity induced increase in resistivity.

Also disclosed herein are embodiments of a method of forming the above-described semiconductor structure. Specifically, the method embodiments can comprise forming a semiconductor substrate having a given conductivity type and a first surface (i.e., a bottom surface). An insulator layer can be formed on a second surface of the semiconductor substrate above the first surface and a device layer can be formed on the insulator layer. Additional processing can also be performed in order to achieve the final semiconductor structure, as described above. Specifically, this additional processing can be performed so as to form, in the semiconductor substrate, a first portion (i.e., a lower portion) adjacent to the first surface and comprising, in a first concentration, a dopant having the given conductivity type. Such additional processing can further be performed so as to form, in the semiconductor substrate, a second portion (i.e., an upper portion) extending from the first portion to the second surface and comprising, in a second concentration that is greater than the first concentration, any of the following: the same dopant as in the first portion, a different dopant than that in the first portion but with the same conductivity type or a combination thereof.

Depending upon the embodiment, this additional processing can be performed during semiconductor substrate formation, after semiconductor substrate formation and before insulator layer formation, after insulator layer formation and before device layer formation and/or after device layer formation and before device formation within the device layer.

For example, one embodiment of the method can comprise forming a single-layer semiconductor substrate having a first surface (i.e., a bottom surface). The single-layer semiconductor substrate can be either in-situ doped or subsequently implanted with a first concentration of a dopant approximately evenly distributed and having a given conductivity type. Next, an insulator layer can be formed on the second surface of the semiconductor substrate and a device layer can be formed above the insulator layer. Additionally, a dopant implantation process can be performed so as to implant either the same dopant as that used during formation of the substrate or a different dopant with the same conductivity type into the semiconductor substrate such that the resulting implant region extends vertically from the second surface to a predetermined depth below the second surface. Consequently, after the implanting process, the semiconductor substrate will comprise a first portion (i.e., a lower portion) adjacent to the first surface and comprising, in the first concentration, the dopant with the given conductivity type. The semiconductor substrate will also comprise a second portion (i.e., an upper portion) comprising the implant region. This implant region will comprise, in a second concentration higher than the first concentration, either the same dopant used in both the semiconductor substrate formation and dopant implantation processes or a combination of the dopant used in the semiconductor substrate formation process plus the different dopant used in the dopant implantation process.

Another embodiment of the method can comprise forming a multi-layer semiconductor substrate. Specifically, to form the multi-layer semiconductor substrate, a first portion (e.g., a first semiconductor layer) can be formed. As this first portion is formed, it can be in-situ doped with a first concentration of a dopant having a given conductivity type. Next, a second portion (e.g., a second semiconductor layer) can be formed on the first portion. As this second portion is formed, it can be in-situ doped with a second higher concentration (i.e., a higher concentration than the first concentration) of either the same dopant as used in the formation of the first portion or a different dopant having the same conductivity type. Then, after the second portion of the semiconductor substrate is formed, an insulator layer can be formed on the second portion.

Optionally, each of the method embodiments can further comprise implanting gas ions into the second portion of the semiconductor substrate and, then, heating the semiconductor substrate so as to create, from the gas ions, micro-cavities in the second portion. Such micro-cavities can be used to balance out, within the second portion, a dopant induced increase in conductivity with a corresponding micro-cavity induced increase in resistivity.

BRIEF DESCRIPTION OF THE SEVERAL VIEWS OF THE DRAWINGS

The embodiments of the invention will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

Figure 16:
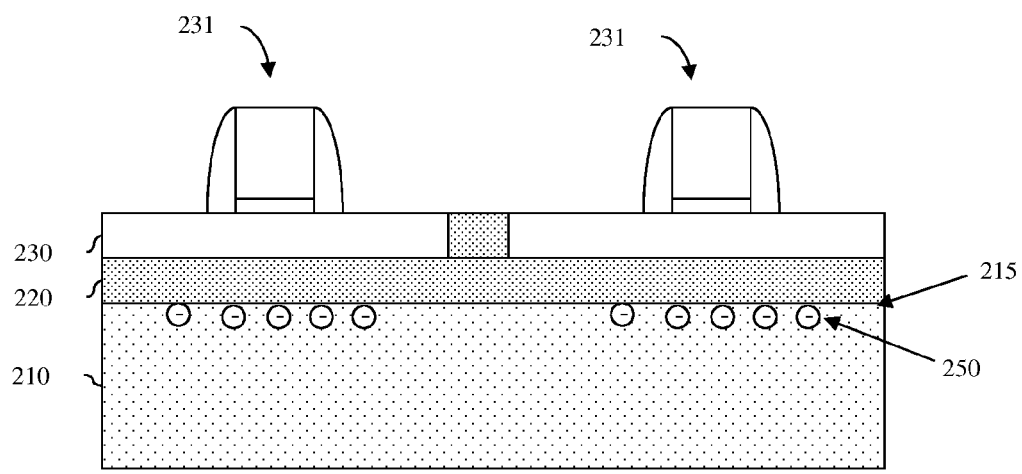
FIG. 16 is a cross-section diagram illustrating a prior art semiconductor structure.

Referring to FIG. 16, as mentioned above, silicon-on-insulator (SOI) structures typically comprise a silicon substrate 210, an insulator layer 220 (e.g., a buried oxide (BOX) layer) above the substrate 210, and device layer 230 (i.e., a silicon layer from which integrated circuit devices 231 are formed) above the insulator layer 220. Such SOI structures offer a number of advantages over bulk silicon structures with respect to the formation of integrated circuit devices generally (e.g., reduction in parasitic capacitances, elimination of latch-up, better control of short channel effects, etc.). However, at least one disadvantage has been noted with respect to the formation of radio frequency (RF) switches using conventional SOI substrates.

Specifically, the Federal Communications Commission (FCC) has set limits (i.e., specifications) on harmonics generation in RF switch applications. Unfortunately, an RF switch (e.g., device 231) formed using a conventional SOI substrate oftentimes will generate second and third order harmonics beyond the FCC limits. That is, in the case of an RF switch on a conventional SOI substrate 210, a fixed charge (i.e., a trapped charge) either within the insulator layer 220 or at the interface between the insulator layer 220 and the silicon substrate 210 can result in an inversion charge 250 at the top surface 215 of the silicon substrate 210 adjacent to the insulator layer 220. This inversion charge 250 can result in the generation of harmonics, including second and third order harmonics. Harmonics are generated when the impedance characteristic of a circuit is not constant with an input signal. A second order harmonic is typically seen from a linear response in impedance (i.e., when impedance is a function of the input signal). A third order harmonic is typically seen from a quadratic response in impedance (i.e., when impedance is a function of the square of the input signal). Considering these second and third order harmonics, the resulting RF switch may easily exhibit harmonics beyond the FCC limits.

A number of solutions for reducing harmonics in RF switch applications have been proposed, including but not limited to, the use of silicon-on-sapphire (SOS) substrates, the use of Gallium Arsenide (GaAs) substrates and the use of SOI substrates with high resistivity handles. Unfortunately, SOS and GaAs substrates are too expensive for mass manufacturing and SOI substrates with high resistivity handles do not provide sufficient harmonics reduction.

In view of the foregoing, disclosed herein are embodiments of a semiconductor structure or, more particularly, a silicon-on-insulator (SOI) structure configured for reduced harmonics. The embodiments can incorporate a silicon-on-insulator (SOI) wafer with a semiconductor substrate, an insulator layer on the semiconductor substrate and a device layer on the insulator layer. The semiconductor substrate can be doped with a relatively low dose of a dopant having a given conductivity type (i.e., it can be a P-substrate or an N-substrate) such that it has a relatively high resistivity (i.e., a resistance of at least 10 ohm-centimeters (Ω-cm)). Additionally, a portion of the semiconductor substrate immediately adjacent to the insulator layer can be doped with a slightly higher dose of the same dopant, a different dopant having the same conductivity type or a combination thereof. Optionally, micro-cavities can be created within this same portion so as to balance out any increase in conductivity due to increased doping with a corresponding increase in resistivity. Increasing the dopant concentration at the semiconductor substrate-insulator layer interface raises the threshold voltage (Vt) of any resulting parasitic capacitors. Increasing this Vt suppresses formation of a parasitic inversion charge layer and, thereby reduces harmonic behavior. Also disclosed herein are embodiments of a method for forming such a semiconductor structure.

Figure 1:
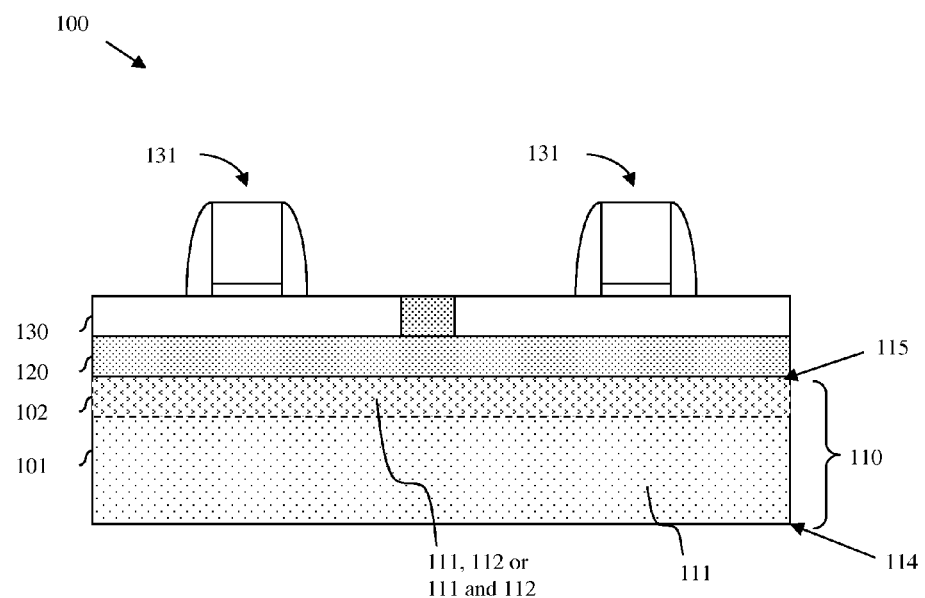
FIG. 1 is a cross-section diagram illustrating an embodiment of a semiconductor structure.

Referring to FIG. 1, disclosed herein are embodiments of a semiconductor structure 100 and, more particularly, a silicon-on-insulator (SOI) structure, configured for reduced harmonics. Specifically, semiconductor structure 100 can comprise a device layer 130. This device layer 130 can comprise a layer within which integrated circuit devices 131 (e.g., field effect transistors, bipolar transistors, resistors, capacitors, diodes, transmission lines, radio frequency switches, etc.) are formed. The device layer 130 can comprise, for example, a silicon (Si) layer, a silicon germanium (SiGe) layer, a silicon carbide (SiC) layer, a silicon germanium carbide (SiGeC) layer, a gallium arsenide (GaAs) layer or any other semiconductor layer suitable for integrated circuit device formation. The device layer 130 can be positioned above an insulator layer 120. This insulator layer 120 can comprise, for example, a buried oxide (BOX) layer or any other suitable insulator layer. Finally, the insulator layer 120 can be positioned above a semiconductor substrate 110 configured for reduced harmonics, as discussed in detail below.

The semiconductor substrate 110 can have a given conductivity type (e.g., P-type conductivity or an N-type conductivity), a first surface 114 (i.e., a bottom surface) and a second surface 115 above the first surface 114 and immediately adjacent to the insulator layer 120. Furthermore, the semiconductor substrate 110 can comprise a first portion 101 (i.e., a lower portion) and a second portion 102 (i.e., an upper portion) above the first portion 101.

Specifically, the first portion 101 can be adjacent to the first surface 114 (i.e., the bottom surface) of the substrate 110 and can comprise, in a first concentration, a dopant 111 having the given conductivity type. For example, the first portion 101 can comprise a first concentration of a Group III dopant, such as boron (B) or indium (In), and, thus, can have a P-type conductivity. Alternatively, the first portion 101 can comprise a first concentration of a Group V dopant, such as arsenic (As), phosphorus (P) or antimony (Sb), and, thus, can have a N-type conductivity.

The second portion 102 can extend from the first portion 101 up to the second surface 115 and can comprise, in a second concentration that is greater than the first concentration, the same dopant 111 as in the first portion 101. For example, in one embodiment, the first portion 101 and second portion 102 can comprise boron (B) such that the substrate 110 comprises a p-type substrate and the concentration of boron (B) in the first portion 101 can be approximately $1 \times 10^{14}$ atoms/cm$^3$ or less and the relatively higher concentration of boron (B) in the second portion 102 can peak at approximately $1 \times 10^{16}$ atoms/cm$^3$ or less. Alternatively, the second portion 102 can comprise, in a second concentration that is greater than the first concentration, either a different dopant 112 than that in the first portion 101 but one with the same conductivity type or a combination of both the same dopant 111 and a different dopant 112.

While the first dopant concentration in the first portion 101 and the second dopant concentration in the second portion 102 are different, they should both be relatively low such that the resistance of the first portion 101 and the sheet resistance of the second portion 102 are still relatively high. For example, for a radio frequency application in the 1-100 GHz range, doping concentrations should ideally be such that the resistance of the first portion 101 is at least 10 ohm-centimeters (Ω-cm) and the sheet resistance of the second portion 102 is at least $1 \times 10^3$ ohms per square (Ω/□). Consequently, despite the relative increase in conductivity within the second portion 102 over the first portion 101, the entire substrate 110 remains a high resistivity substrate. Additionally, the second portion 102 should be relatively thin as compared to the first portion 102.

It should be understood that for practical reasons related to currently available processing techniques, the second portion 102 may be as large as several microns (μm) thick; however, preferably, it should be as thin as practically possible (e.g., a fraction of a micron (μm)). For example, the second portion 102 can have a thickness ranging between 2 and 1500 nanometers (nm) and, preferably, ranging between 200 and 800 nm. Whereas the first portion 101 can have a thickness ranging between 10 microns (μm) and several millimeters (mm).

It should further be understood that the exemplary resistance and sheet resistance values mentioned above are target values ideal for applications in the 1-100 GHz range and that alternative resistance and sheet resistance values may be appropriate for applications above or below this range. For example, the resistance values may need to be lowered for higher frequency applications or raised for lower frequency applications.

Finally, in one embodiment, the second portion 102 can comprise an implant region within a single-layer P- or N-semiconductor substrate. That is, the semiconductor substrate 110 can comprise a single-layer semiconductor substrate 110 (e.g., a single silicon (Si) layer, a single silicon germanium (SiGe) layer, a single silicon carbide (SiC) layer, a single silicon germanium carbide (SiGeC) layer, a single gallium arsenide (GaAs) layer or any other suitable semiconductor layer) doped with the dopant 111 approximately evenly distributed from the first surface 114 (i.e., the bottom surface) to the second surface 115. An implant region further doped with the same dopant 111 or a different dopant 112, having the same conductivity type, can be positioned within this single semiconductor layer immediately adjacent to the second surface 115 and only extending vertically into the semiconductor substrate 110 to a predetermined depth above the first surface 114. Thus, in this embodiment, the second portion 102 of the substrate 110 comprises the implant region doped with either the dopant 111 or both the dopant 111 and the dopant 112 and the first portion 101 of the substrate 110 comprises that portion of the substrate 110 below the implant region.

Alternatively, the second portion 102 of the semiconductor substrate 110 can comprise a top semiconductor layer of a multi-layer semiconductor substrate 110. That is, the first portion 101 of the substrate 110 can comprise a first semiconductor layer. For example, it can comprise any of a silicon (Si) layer, a silicon germanium (SiGe) layer, a silicon carbide (SiC) layer, a silicon germanium carbide (SiGeC) layer, a gallium arsenide (GaAs) layer or any other suitable semiconductor layer. The second portion 102 can comprise a second semiconductor layer positioned on top of the first semiconductor layer. For example, the second semiconductor layer can comprise any of a silicon (Si) layer, a silicon germanium (SiGe) layer, a silicon carbide (SiC) layer, a silicon germanium carbide (SiGeC) layer, a gallium arsenide (GaAs) layer or any other suitable semiconductor layer (e.g., a polysilicon layer).

Figure 2:
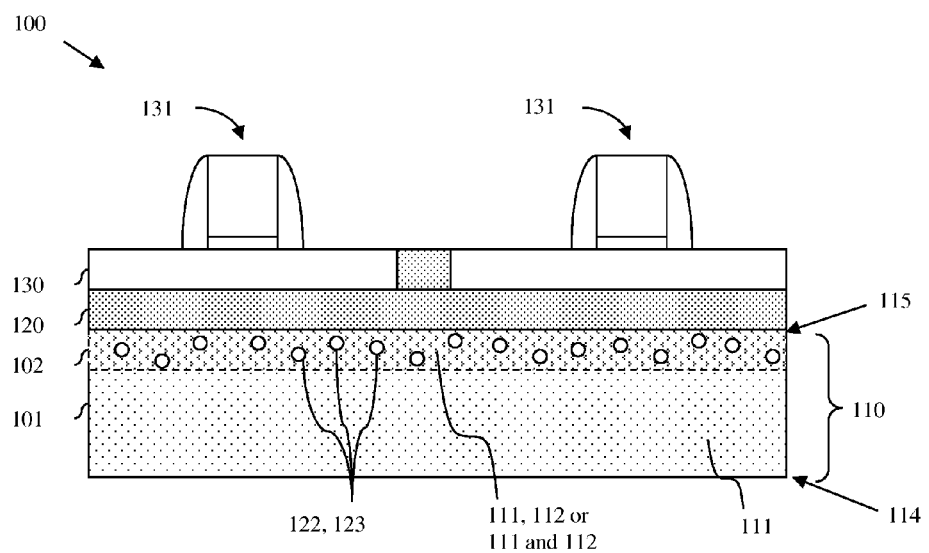
FIG. 2 is a cross-section diagram illustrating microcavities incorporated into the semiconductor substrate of the embodiment of FIG. 1.

Optionally, as illustrated in FIG. 2, the second portion 102 of the semiconductor substrate 110 can further comprise a plurality of micro-cavities 122 (i.e., closed micro-pores, micro-cells, etc.) distributed throughout. That is, the second portion 102 can comprise a porous portion of the semiconductor substrate 110 above a non-porous first portion 101. Those skilled in the art will recognize that such micro-cavities can be formed using a technique in which an inert gas ions (e.g., helium (He), Argon (Ar), nitrogen ($N_2$), Xenon (Xe) or Krypton (Kr) ions) are implanted into the substrate 110 and, then, the substrate is annealed. Thus, the micro-cavities 122 can be filled with any one of the above-mentioned inert gases 123. The density and size of such micro-cavities 122 can be predetermined, as a function of the type of inert gas used, the implant does used, the anneal temperature used, etc., so that they balance out, within the second portion 102, a dopant induced increase in conductivity with a corresponding micro-cavity induced increase in resistivity.

In the semiconductor structure 100, described above, the relative increase in the dopant concentration within the second portion 102 at the top surface 115 of the semiconductor substrate (i.e., at the substrate-insulator layer interface) minimizes harmonic behavior. Specifically, the relative increase in the dopant concentration within the second portion 102 raises the threshold voltage (Vt) of any resulting parasitic capacitors (i.e., parasitic capacitors formed as a result of coupling between the device layer 130, insulator layer 120 and substrate 110, when voltage is applied to the device layer 130). Increasing this Vt suppresses formation of a parasitic inversion charge layer at the second surface 115 of the substrate 110 and, thereby reduces harmonic behavior.

Figure 3:
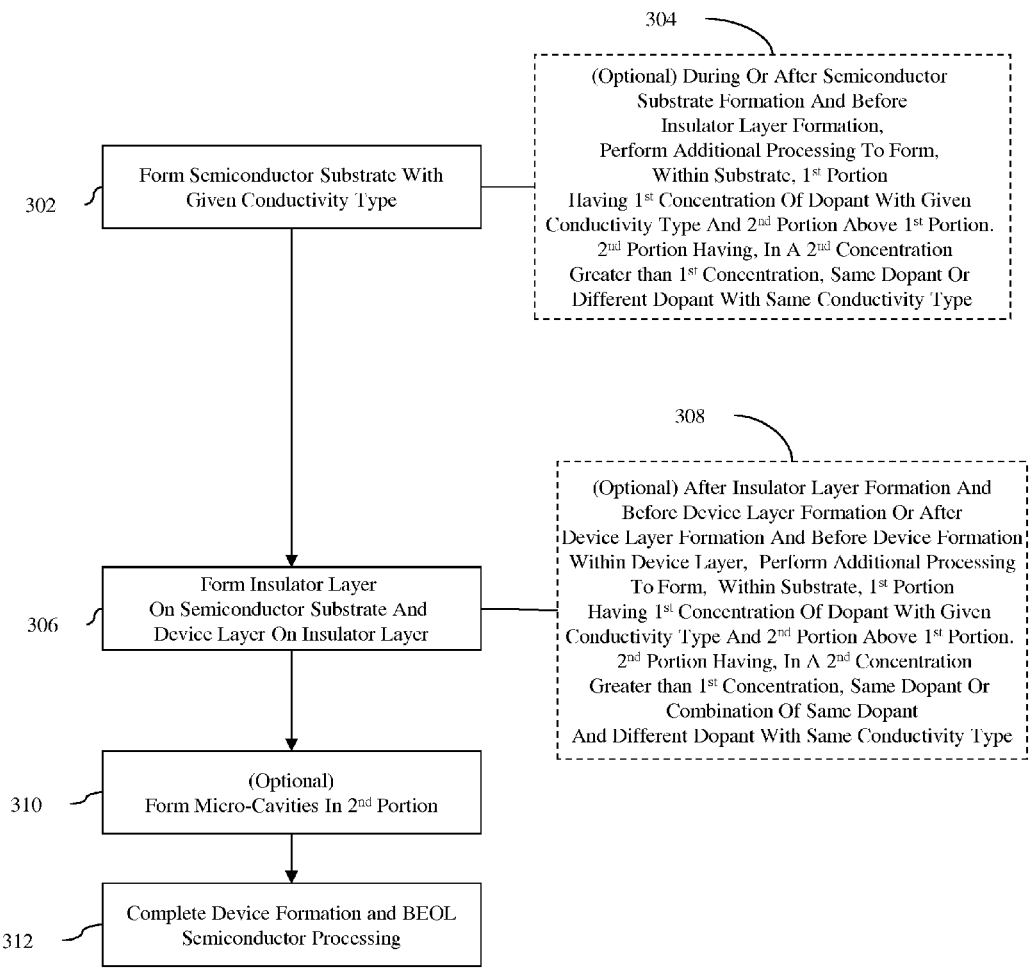
FIG. 3 is a flow diagram illustrating generally method embodiments for forming the semiconductor structure of FIGS. 1 and 2.

Referring to FIG. 3, also disclosed herein are embodiments of a method of forming the above-described semiconductor structure 100, as illustrated in FIGS. 1 and 2. Specifically, the method embodiments can comprise forming a semiconductor substrate 110 having a given conductivity type and a first surface 114 (i.e., a bottom surface) (302). An insulator layer 120 (e.g., a buried oxide (BOX) layer or any other suitable insulator layer) can be formed (e.g., deposited) adjacent to a second surface 115 of the semiconductor substrate 110 above the first surface 114 and a device layer 130 (e.g., a silicon (Si) layer, a silicon germanium (SiGe) layer, a silicon carbide (SiC) layer, a silicon germanium carbide (SiGeC) layer, a gallium arsenide (GaAs) layer or any other semiconductor layer suitable for integrated circuit device formation) can be formed on the insulator layer 120 (306).

Additional processing can also be performed in order to achieve the final semiconductor structure, as described above (304 or 308). Specifically, this additional processing can be performed so as to form, in the semiconductor substrate 110, a first portion 101 (i.e., a lower portion) adjacent to the first surface 114 (i.e., the bottom surface) and comprising, in a first concentration, a dopant 111 having the given conductivity type. For example, the additional processing can be performed such that the first portion 101 comprises a first concentration of a Group III dopant (e.g., boron (B) or indium (In)) and, thereby has a P-type conductivity. Alternatively, the additional processing can be performed such that the first portion 101 comprises a first concentration of a Group V dopant (e.g., arsenic (As), phosphorus (P) or antimony (Sb)) and, thereby has a N-type conductivity. This additional processing can further be performed so as to form, in the semiconductor substrate 110, a second portion 102 (i.e., an upper portion) extending from the first portion 101 to the second surface 115 and comprising, in a second concentration that is greater than the first concentration, any of the following: the same dopant 111 as in the first portion 101, a different dopant 112 than that in the first portion 101 but with the same conductivity type or a combination thereof.

Depending upon the embodiment, this additional processing can be performed during semiconductor substrate 110 formation, after semiconductor substrate 110 formation and before insulator layer 120 formation (see process 304 of FIG. 3), after insulator layer 120 formation and before device layer 130 formation and/or after device layer 130 formation and before device formation within the device layer 130 (see process 308 of FIG. 3).

Figure 4:
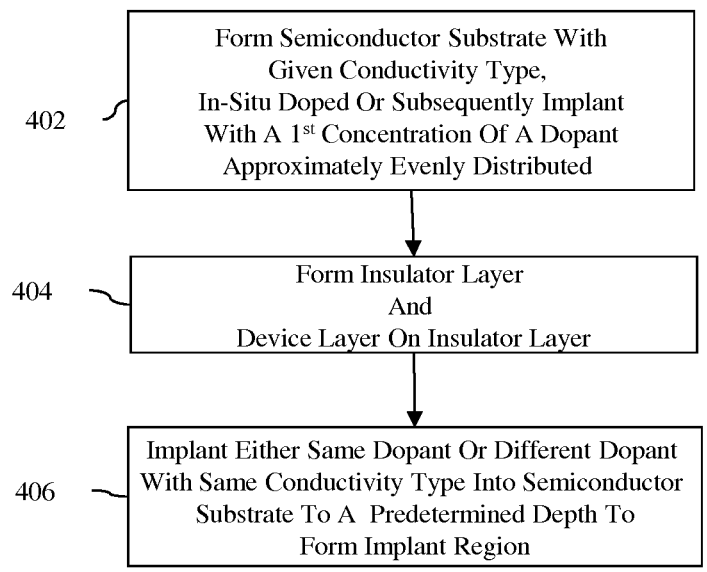
FIG. 4 is a flow diagram illustrating a specific method embodiment for forming the semiconductor structure of FIGS. 1 and 2.
Figure 5:
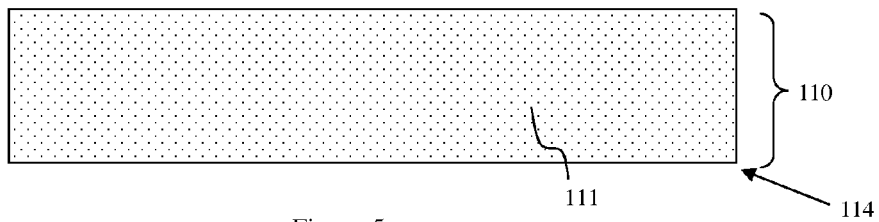
FIG. 5 is a cross-section diagram illustrating a partially completed structure formed according to the method of FIG. 4.

For example, referring to FIG. 4, in one exemplary embodiment of the method, a single-layer semiconductor substrate 110, having a first surface 114 (i.e., a bottom surface), can be formed (402, see FIG. 5). This single-layer semiconductor substrate 110 can be formed using conventional processing techniques used to form bulk semiconductor substrates. Such processing techniques are well-known in the art and, thus, are omitted from this specification in order to allow the reader to focus on the salient aspects of the embodiments described herein. This single-layer semiconductor substrate 110 can be formed such that it comprises, for example, silicon (Si), silicon germanium (SiGe), silicon carbide (SiC), silicon germanium carbide (SiGeC), gallium arsenide (GaAs) or any other suitable semiconductor material. Additionally, this single-layer semiconductor substrate 110 can be either in-situ doped or subsequently implanted with a first concentration of a dopant 111 approximately evenly distributed and having a given conductivity type. For example, the single-layer semiconductor substrate 110 can be either in-situ doped or subsequently implanted with a first concentration of a Group III dopant, such as boron (B) or indium (In), (i.e., a P-type dopant). Alternatively, the single-layer semiconductor substrate can be either in-situ doped or subsequently implanted a first concentration of a Group V dopant, such as arsenic (As), phosphorus (P) or antimony (Sb), (i.e., a N-type dopant).

Figure 6:
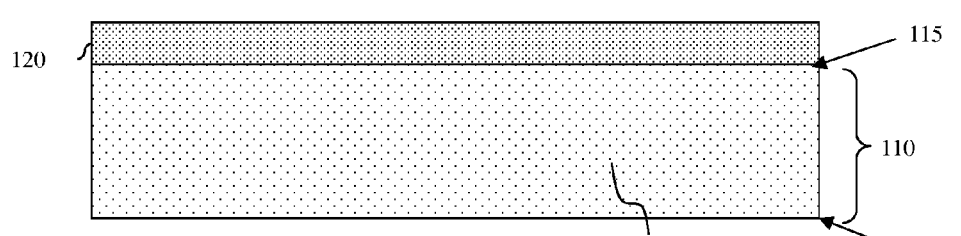
FIG. 6 is a cross-section diagram illustrating a partially completed structure formed according to the method of FIG. 4.
Figure 7:
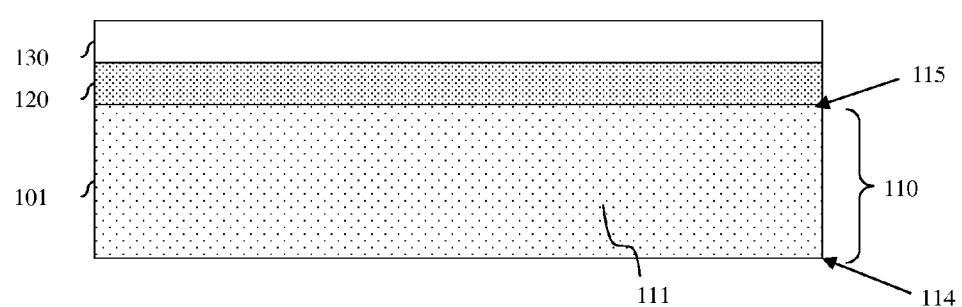
FIG. 7 is a cross-section diagram illustrating a partially completed structure formed according to the method of FIG. 4.

Subsequently, an insulator layer 120 and a device layer 130 on the insulator layer 120 can be formed (404, see FIG. 7). For example, in one embodiment, the single-layer semiconductor substrate 110 can have a first surface 114 (i.e., a bottom surface) and a second surface 115 (i.e., a top surface) opposite (i.e., above) the first surface 114. An insulator layer 120 (e.g., a silicon dioxide ($SiO_2$) layer) can be formed (e.g., deposited) on the second surface 115 (see FIG. 6). Next, a device layer 130 (e.g., a silicon (Si) layer, a silicon germanium (SiGe) layer, a silicon carbide (SiC) layer, a silicon germanium carbide (SiGeC) layer, a gallium arsenide (GaAs) layer or any other suitable device layer) can be formed (e.g., deposited) on the insulator layer 120 (see FIG. 7). Alternatively, a separation by implantation of oxygen (SIMOX) process can be used to implant a buried oxide (BOX) layer 120 into the single-layer semiconductor substrate 110, thereby creating in a single process step in an implanted insulator layer 120 separates a device layer 130 from a remaining portion of the single-layer semiconductor substrate 110. In this case, the remaining portion of the single layer semiconductor substrate 110 will have the first surface 114 (i.e., a bottom surface) and a second surface 115 (i.e., the BOX-substrate interface) above the first surface 114 and immediately adjacent to the BOX layer 120 (see FIG. 7). SIMOX techniques are well-known in the art and, thus, are omitted from this specification in order to allow the reader to focus on the salient aspects of the embodiments described herein.

Figure 8:
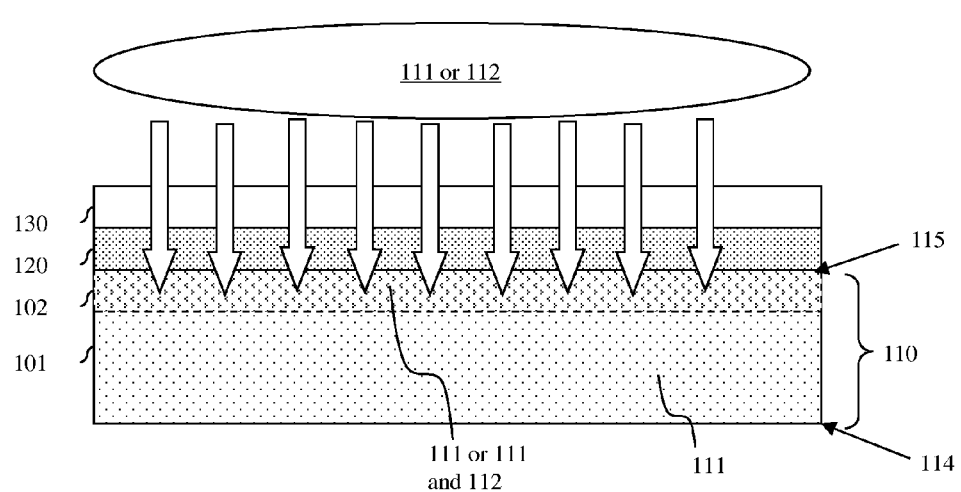
FIG. 8 is a cross-section diagram illustrating a partially completed structure formed according to the method of FIG. 4.

Additionally, either the same dopant 111 as that used at process 402 or a different dopant 112 with the same conductivity type can be implanted into the semiconductor substrate 110 to form an implant region that extends vertically from the second surface 115 to a predetermined depth above the first surface 114 (406). Preferably, this dopant implantation process 406 can be performed after the insulator and device layers 120, 130 are formed (e.g., when the insulator layer 120 and device layer 130 are formed by either deposition or by SIMOX process). For example, as illustrated in FIG. 8, at process 406, a dopant 111 or a different dopant 112 can be implanted through the device layer 130, the insulator layer 120, second surface 115 and into the semiconductor substrate 110, thereby forming an implant region. Alternatively, the dopant implantation process 406 may be performed prior to formation of the insulator and device layers 120, 130 or after formation of the insulator layer 120, but before the formation of the device layer 130 (e.g., when the insulator layer 120 and device layer 130 are formed by separate deposition processes). Regardless of when it is performed, the dopant implantation process 406 can be selectively controlled so that, as mentioned above, the resulting implant region extends vertically from the second surface 115 of the substrate 110 down to the predetermined depth above the first surface 114 (i.e., the implant region does not cover the entire thickness of the substrate 110). Consequently, after the dopant implantation process 406 is performed, the semiconductor substrate 110 will comprise a first portion 101 (i.e., a lower portion) adjacent to the first surface 114 and a second portion 102 (i.e., an upper portion) above the first portion 101. The first portion 101 will comprise, in the first concentration, the dopant 111 with the given conductivity type. The second portion 102 will comprise the implant region having, in a second concentration higher than the first concentration, either only the dopant 111 (e.g., when the same dopant 111 is used at processes 402 and 406) or a combination of dopants 111 and 112 (e.g., when different dopants are used at process 402 and 406).

Figure 9:
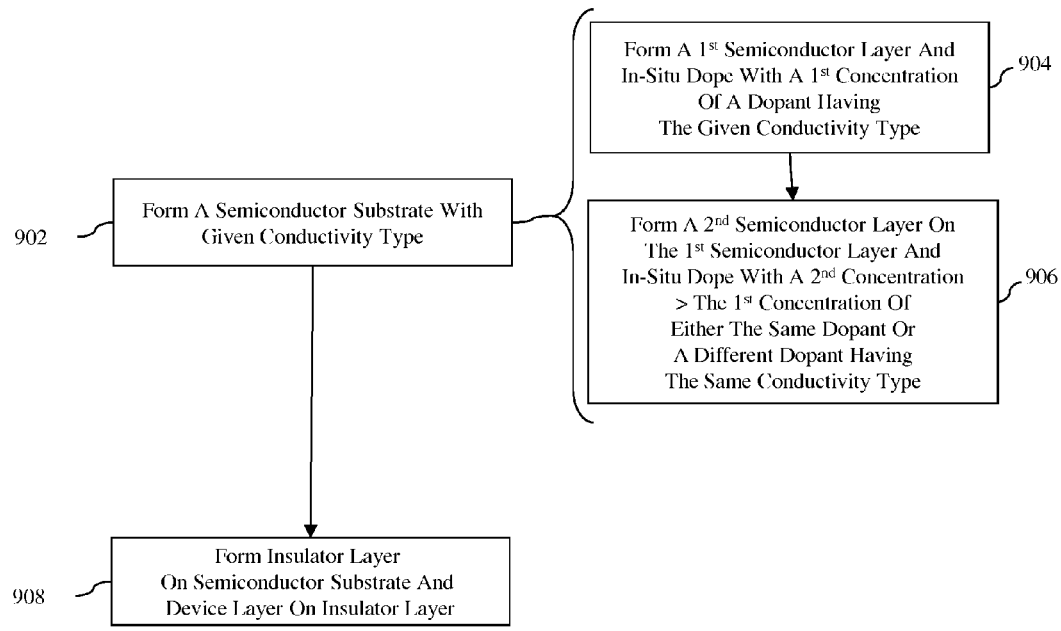
FIG. 9 is a flow diagram illustrating another specific method embodiment for forming the semiconductor structure of FIGS. 1 and 2.
Figure 10:
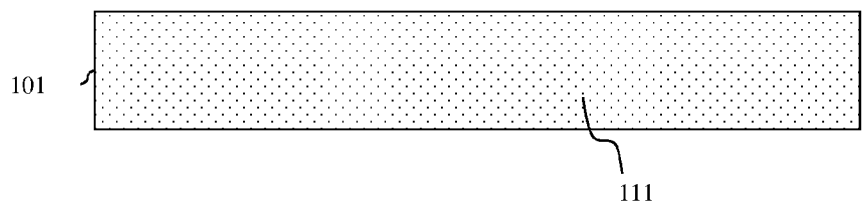
FIG. 10 is a cross-section diagram illustrating a partially completed structure formed according to the method of FIG. 9.

Referring to FIG. 9, another embodiment of the method can comprise forming a multi-layer semiconductor substrate (902). Specifically, to form the multi-layer semiconductor substrate, a first portion 101 (e.g., a first semiconductor layer) can be formed (904, see FIG. 10). This first semiconductor layer can comprise, for example, any of a silicon (Si) layer, a silicon germanium (SiGe) layer, a silicon carbide (SiC) layer, a silicon germanium carbide (SiGeC) layer, a gallium arsenide (GaAs) layer or any other suitable semiconductor layer, and can be formed using conventional processing techniques used to form bulk semiconductor substrates. Such processing techniques are well-known in the art and, thus, are omitted from this specification in order to allow the reader to focus on the salient aspects of the embodiments described herein. As this first portion is formed at process 904, it can be in-situ doped with a first concentration of a dopant 111 having a given conductivity type (e.g., n-Type or P-type).

Figure 11:
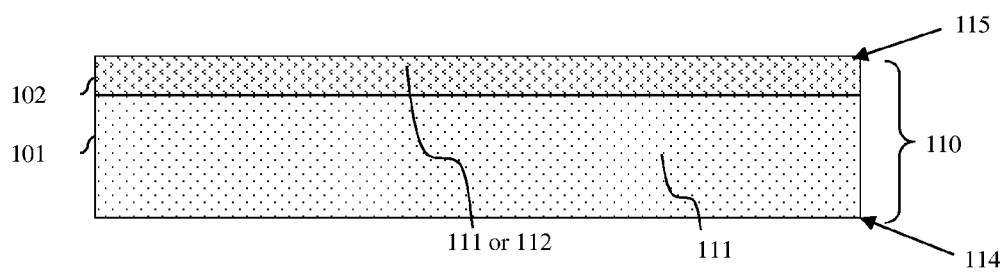
FIG. 11 is a cross-section diagram illustrating a partially completed structure formed according to the method of FIG. 9.
Figure 12:
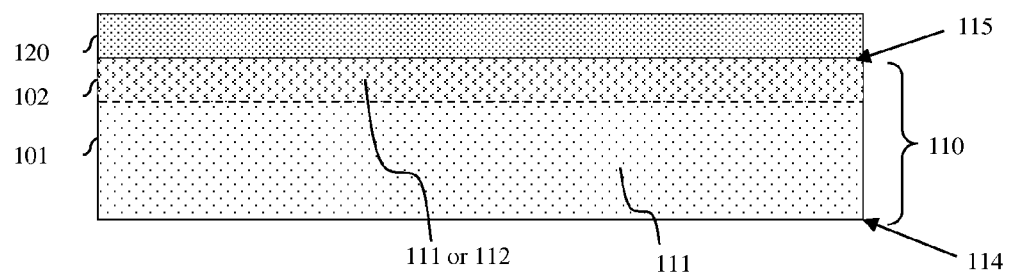
FIG. 12 is a cross-section diagram illustrating a partially completed structure formed according to the method of FIG. 9.
Figure 13:
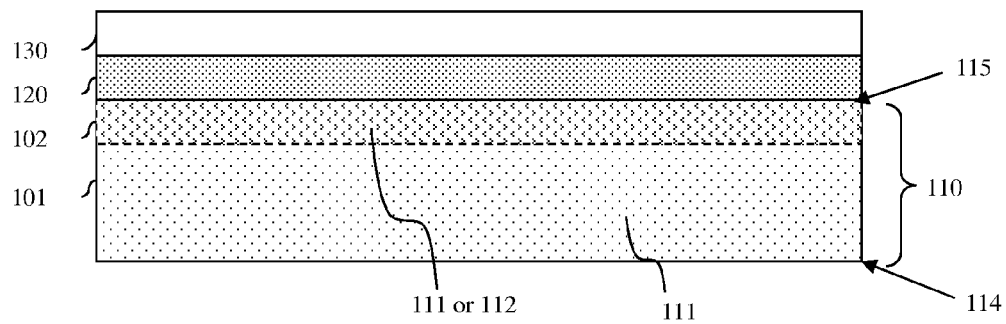
FIG. 13 is a cross-section diagram illustrating a partially completed structure formed according to the method of FIG. 9.

Next, a second portion 102 (e.g., a second semiconductor layer) can be formed on the first portion 102 (906, see FIG. 11). The second portion 102 can comprise, for example, any of a silicon (Si) layer, a silicon germanium (SiGe) layer, a silicon carbide (SiC) layer, a silicon germanium carbide (SiGeC) layer, a gallium arsenide (GaAs) layer or any other suitable semiconductor layer (e.g., a polysilicon layer), and be formed, for example, by an epitaxial deposition processes. Such processing techniques are well-known in the art and, thus, are omitted from this specification in order to allow the reader to focus on the salient aspects of the embodiments described herein. As this second portion 102 is formed, it can be in-situ doped with a second higher concentration (i.e., a higher concentration than the first concentration) of either the same dopant 111 as used in the first portion 102 (at process 804) or a different dopant having the same conductivity type. Then, after the second portion 102 of the semiconductor substrate is formed, an insulator layer 120 (e.g., a buried oxide (BOX) layer or any other suitable insulator layer) can be formed (e.g., deposited) on the second portion 102 and a device layer 130 (e.g., a silicon (Si) layer, a silicon germanium (SiGe) layer, a silicon carbide (SiC) layer, a silicon germanium carbide (SiGeC) layer, a gallium arsenide (GaAs) layer or any other semiconductor layer suitable for integrated circuit device formation) can be formed on the insulator layer (808, see FIGS. 12-13).

It should be noted that, while the process steps of the method embodiments, as described above, are selectively controlled so as to ensure that the first dopant concentration in the first portion 101 and the second dopant concentration in the second portion 102 are different, they should further be selectively controlled so as to ensure that both the first dopant concentration and the second dopant concentration remain relatively low so that the resistance of the first portion 101 and the sheet resistance of the second portion 102, in turn, remain relatively high. For example, for a radio frequency application in the 1-100 GHz range, in one embodiment, the first portion 101 and second portion 102 can both be doped with boron (B) such that the substrate 110 comprises a P-type substrate and such that the concentration of boron (B) in the first portion 101 is approximately $1 \times 10^{14}$ atoms/cm$^3$ or less and the relatively higher concentration of boron (B) in the second portion 102 can peak at approximately $1 \times 10^{16}$ atoms/cm$^3$ or less. This will ensure that the resistance of the first portion 101 is at least 10 ohm-centimeters (Ω-cm) and the sheet resistance of the second portion 102 is at least $1 \times 10^3$ ohms per square (Ω/□). Thus, despite the relative increase in conductivity within the second portion 102 over the first portion 101, the entire substrate 110 will remain a high resistivity substrate. Additionally, the substrate 110 should be formed such that the second portion 102 is relatively thin as compared to the first portion 102.

It should be understood that for practical reasons related to currently available processing techniques, the second portion 102 may be formed as large as several microns (μm) thick; however, preferably, the second portion 102 will be formed as thins as is practically possible (e.g., a fraction of a micron (μm)). For example, the second portion 102 can be formed to have a thickness ranging between 2 and 1500 nanometers (nm) and, preferably, ranging between 200 and 800 nanometers (nm). Whereas the first portion 101 can be formed to have a thickness ranging between 10 microns (μm) and several millimeters (mm).

It should further be understood that the exemplary resistance and sheet resistance values mentioned above are target values ideal for applications in the 1-100 GHz range and that alternative resistance and sheet resistance values may be appropriate for applications above or below this range. For example, the resistance values may need to be lowered for higher frequency applications or raised for lower frequency applications.

Figure 14:
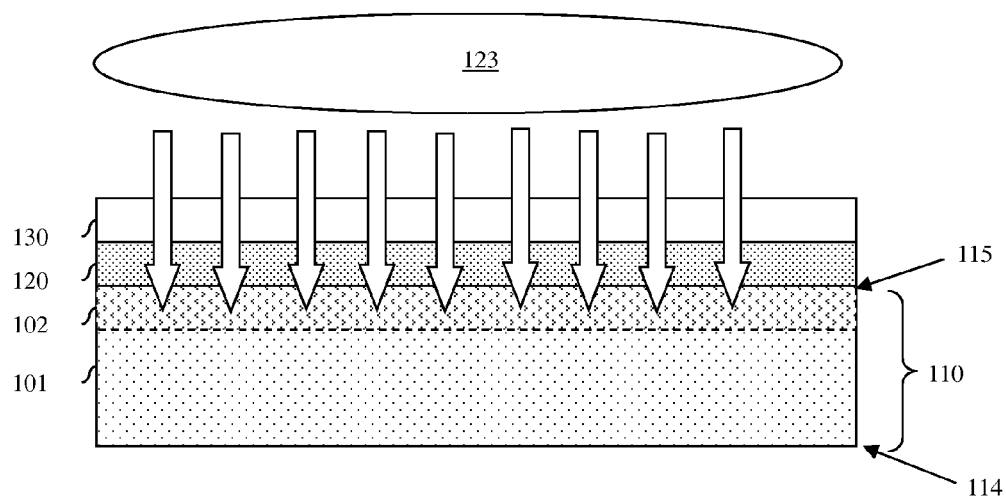
FIG. 14 is a cross-section diagram illustrating a partially completed structure formed according to the method of FIG. 3.
Figure 15:
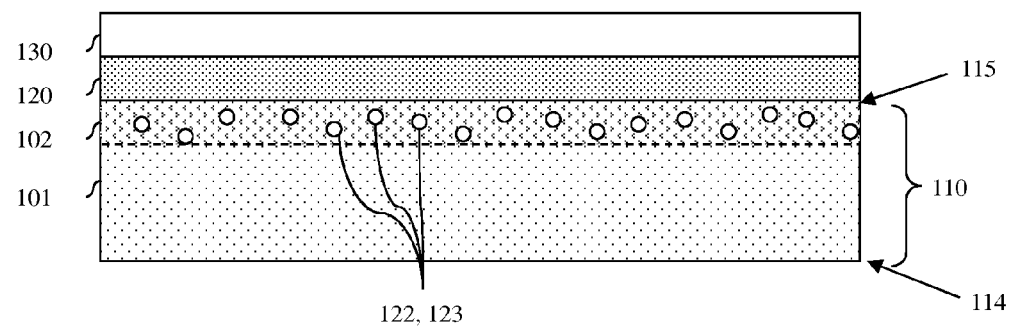
FIG. 15 is a cross-section diagram illustrating a partially completed structure formed according to the method of FIG. 4.

Referring again to FIG. 3, optionally, each of the method embodiments can further comprise forming micro-cavities 122 (i.e., closed micro-pores, micro-cells, etc.) within the second portion 102 of the substrate 110 (310, see FIG. 15). Specifically, inert gas ions 123 (e.g., helium (He), Argon (Ar), nitrogen ($N_2$), Xenon (Xe) or Krypton (Kr) ions) can be implanted into the second portion 102 of the substrate 110 (see FIG. 14). Then, an anneal process (e.g., a rapid thermal anneal process, laser anneal process, etc.) can be performed. By heating the semiconductor substrate 110 following the gas ion implantation process, micro-cavities 122 (i.e., micro-pores, micro-cells) can be formed (see FIG. 15). Processing techniques used to form micro-cavities in semiconductor materials are well-known in the art and, thus, are omitted from this specification in order to allow the reader to focus on the salient aspects of the embodiments described herein. These micro-cavities 122 can be used to balance out, within the second portion, a dopant induced increase in conductivity with a corresponding micro-cavity induced increase in resistivity.

Finally, integrated circuit devices 131 (e.g., field effect transistors, bipolar transistors, resistors, capacitors, diodes, transmission lines, radio frequency switches, etc.) can be formed in the device layer 130 (see FIGS. 1 and 2) and standard back end of the line (BEOL) processing can further be performed in order to complete the semiconductor structure 100 (312). Techniques for integrated circuit device formation and BEOL processing are well-known in the art and, thus, are omitted from this specification in order to allow the reader to focus on the salient aspects of the embodiments described herein.

It should be understood that the method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, it should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Finally, it should be understood that the corresponding structures, materials, acts, and equivalents of all means or step plus function elements in the claims below are intended to include any structure, material, or act for performing the function in combination with other claimed elements as specifically claimed. The description of the structure and method embodiments has been presented for purposes of illustration and description, but is not intended to be exhaustive or limited to the invention in the form disclosed. Many modifications and variations will be apparent to those of ordinary skill in the art without departing from the scope and spirit of the invention. The structure and method embodiments were chosen and described in order to best explain the principles of the invention and the practical application, and to enable others of ordinary skill in the art to understand the invention for various embodiments with various modifications as are suited to the particular use contemplated.

Therefore, disclosed above are embodiments of a semiconductor structure or, more particularly, a silicon-on-insulator (SOI) structure configured for reduced harmonics. The embodiments can incorporate a silicon-on-insulator (SOI) wafer with a semiconductor substrate, an insulator layer on the semiconductor substrate and a device layer on the insulator layer. The semiconductor substrate can be doped with a relatively low dose of a dopant having a given conductivity type (i.e., it can be a P-substrate or an N-substrate) such that it has a relatively high resistivity (i.e., a resistance of at least 10 ohm-centimeters ($\Omega$-cm). Additionally, a portion of the semiconductor substrate immediately adjacent to the insulator layer can be doped with a slightly higher dose of the same dopant, a different dopant having the same conductivity type or a combination thereof. Optionally, micro-cavities can be created within this same portion so as to balance out any increase in conductivity due to increased doping with a corresponding increase in resistivity. Increasing the dopant concentration at the semiconductor substrate-insulator layer interface raises the threshold voltage (Vt) of any resulting parasitic capacitors. Increasing this Vt suppresses formation of a parasitic inversion charge layer and, thereby reduces harmonic behavior. The embodiments have the advantage of providing such reduced harmonics and minimal additional cost. Also disclosed herein are embodiments of a method for forming such a semiconductor structure.

What is claimed is:

1. A method of forming a semiconductor structure comprises:
    forming a semiconductor substrate having a first surface and a second surface opposite said first surface;
    forming an insulator layer on and immediately adjacent to said second surface;
    performing additional processing so as to form in said semiconductor substrate:
        a first portion immediately adjacent to said first surface and comprising, in a first concentration, a dopant having a given conductivity type such that said first portion has said given conductivity type; and,
        a second portion extending vertically from immediately adjacent to said first portion to said second surface immediately adjacent to said insulator layer and comprising, in a second concentration greater than said first concentration, one of a same dopant as said dopant in said first portion, a different dopant than said dopant in said first portion, wherein said different dopant has said given conductivity type, and a combination of said same dopant as said dopant in said first portion and said different dopant than said dopant in said first portion such that said second portion has said given conductivity type at a higher conductivity level than said first portion; and,
    forming a device layer on said insulator layer, said device layer comprising multiple semiconductor devices and said first portion and said second portion of said semiconductor substrate each extending laterally and continuously so as to traverse below each of said multiple semiconductor devices.

2. The method of claim 1, further comprising:
implanting gas ions into said second portion; and,
heating said semiconductor substrate so as to create, from said gas ions, micro-cavities in said second portion.

3. The method of claim 1, said additional processing being performed such that said first portion has a resistance of at least 10 ohm-centimeters ($\Omega$-cm) and said second portion has a sheet resistance of at least $1\times10^3$ ohms per square ($\Omega/\square$).

4. The method of claim 1, said additional processing being performed such that said second portion suppresses formation of a parasitic inversion charge layer at said first surface and, thereby reduces harmonic behavior.

5. A method of forming a semiconductor structure comprises:
forming a semiconductor substrate having a first surface and a second surface opposite said first surface, said forming of said semiconductor substrate comprising, during said forming of said semiconductor substrate, doping said semiconductor substrate with a first concentration of a dopant having a given conductivity type;
forming an insulator layer on and immediately adjacent to a second surface of said substrate above said first surface;
implanting one of said dopant and a different dopant having said given conductivity type into said semiconductor substrate to a predetermined depth below said second surface such that, after said implanting, said semiconductor substrate comprises:
  a first portion immediately adjacent to said first surface and comprising, in said first concentration, said dopant; and
  a second portion extending vertically from said predetermined depth to said second surface and comprising, in a second concentration higher than said first concentration, one of said dopant and a combination of said dopant and said different dopant such that said second portion has said given conductivity type at a higher conductivity level than said first portion; and,
forming a device layer on said insulator layer, said device layer comprising multiple semiconductor devices and said first portion and said second portion of said semiconductor substrate each extending laterally and continuously so as to traverse below each of said multiple semiconductor devices.

6. The method of claim 5, further comprising:
implanting gas ions into said second portion; and,
heating said semiconductor substrate so as to create, from said gas ions, micro-cavities in said second portion.

7. The method of claim 5, said implanting being performed such that said first portion has a resistance of at least 10 ohm-centimeters ($\Omega$-cm) and said second portion has a sheet resistance of at least $1\times10^3$ ohms per square ($\Omega/\square$).

8. The method of claim 5, said implanting being performed such that said second portion suppresses formation of a parasitic inversion charge layer at said first surface and, thereby reduces harmonic behavior.

9. A method of forming a semiconductor structure comprises:
forming a semiconductor substrate having a first surface and a second surface opposite said first surface;
forming an insulator layer on and immediately adjacent to said second surface;
performing additional processing so as to form in said semiconductor substrate:
  a first portion immediately adjacent to said first surface and comprising, in a first concentration, a dopant having a given conductivity type such that said first portion has said given conductivity type; and
  a second portion extending vertically from said first portion to said second surface and comprising said dopant in a second concentration greater than said first concentration such that said second portion has said given conductivity type at a higher conductivity level than said first portion; and,
forming a device layer on said insulator layer, said device layer comprising multiple semiconductor devices and said first portion and said second portion of said semiconductor substrate each extending laterally and continuously so as to traverse below each of said multiple semiconductor devices.

10. The method of claim 9, further comprising:
implanting gas ions into said second portion; and,
heating said semiconductor substrate so as to create, from said gas ions, micro-cavities in said second portion.

11. The method of claim 9, said additional processing being performed such that said first portion has a resistance of at least 10 ohm-centimeters ($\Omega$-cm).

12. The method of claim 9, said additional processing further being performed such that said second portion has a sheet resistance of at least $1\times10^3$ ohms per square ($\Omega/\square$).

13. The method of claim 9, said additional processing being performed such that said second portion suppresses formation of a parasitic inversion charge layer at said first surface and, thereby reduces harmonic behavior.

14. The method of claim 9, said semiconductor substrate comprising a silicon substrate, said insulator layer comprising an oxide layer on said second surface of said silicon substrate and said method further comprising forming a silicon layer on said oxide layer such that said silicon layer is separated from said second portion of said silicon substrate by said oxide layer.

* * * * *